United States Patent
Han et al.

(10) Patent No.: US 9,620,743 B2
(45) Date of Patent: Apr. 11, 2017

(54) ORGANIC LIGHT-EMITTING DISPLAY APPARATUS AND METHOD OF MANUFACTURING THE SAME

(71) Applicant: SAMSUNG DISPLAY CO., LTD., Yongin, Gyeonggi-Do (KR)

(72) Inventors: Kyul Han, Yongin (KR); Hyo-Yeon Kim, Yongin (KR); Hye-Yeon Shim, Yongin (KR); Sang-Woo Lee, Yongin (KR); Heun-Seung Lee, Yongin (KR); Sang-Woo Pyo, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/561,623

(22) Filed: Dec. 5, 2014

(65) Prior Publication Data

US 2015/0318515 A1 Nov. 5, 2015

(30) Foreign Application Priority Data

Apr. 30, 2014 (KR) ........................ 10-2014-0052979

(51) Int. Cl.
*H01L 51/56* (2006.01)
*H01L 51/52* (2006.01)
*H01L 27/32* (2006.01)

(52) U.S. Cl.
CPC .......... *H01L 51/56* (2013.01); *H01L 27/3211* (2013.01); *H01L 51/5221* (2013.01);
(Continued)

(58) Field of Classification Search
None
See application file for complete search history.

(56) References Cited

U.S. PATENT DOCUMENTS 8,415,874 B2 4/2013 Song et al.
8,421,097 B2 4/2013 Jeong et al.
(Continued)

FOREIGN PATENT DOCUMENTS

KR 10-0752384 B1 8/2007
KR 10-2010-0128153 A 12/2010
(Continued)

OTHER PUBLICATIONS

Vorobyev et al., "Colorizing Metals With Femtosecond Laser Pulses", Applied Physics Letters 92, 041914 (2008), doi: 10.1063/1.2834902, pp. 1-3.
(Continued)

*Primary Examiner* — Whitney T Moore
*Assistant Examiner* — Scott R Wilson
(74) *Attorney, Agent, or Firm* — Lee & Morse, P.C.

(57) ABSTRACT

Provided is an organic light-emitting display apparatus including a substrate; a first pixel electrode for first color emission, a second pixel electrode for second color emission, and a third pixel electrode for third color emission, the first pixel electrode, the second pixel electrode, and the third pixel electrode being spaced apart from each other on the substrate; a first color emission layer on the first pixel electrode, a second color emission layer on the second pixel electrode, and a third color emission layer on the third pixel electrode; an opposite electrode on the first color emission layer, the second color emission layer, and the third color emission layer; and a capping layer that includes a same material as the opposite electrode and is porous.

14 Claims, 4 Drawing Sheets

(52) U.S. Cl.
CPC ...... *H01L 51/5253* (2013.01); *H01L 51/5268* (2013.01); *H01L 51/5271* (2013.01); *H01L 2251/5315* (2013.01); *H01L 2251/558* (2013.01)

(56) References Cited

U.S. PATENT DOCUMENTS

| | | | |
|---|---|---|---|
| 2008/0023724 A1* | 1/2008 | Takeda | H01L 51/5262 257/103 |
| 2012/0319145 A1 | 12/2012 | Weaver et al. | |
| 2014/0042422 A1* | 2/2014 | Silverman | H01L 51/5275 257/40 |
| 2015/0230728 A1* | 8/2015 | Hafezi | A61B 5/073 600/302 |

FOREIGN PATENT DOCUMENTS

| | | |
|---|---|---|
| KR | 10-2011-0039056 A | 4/2011 |
| KR | 10-2011-0061317 A | 6/2011 |
| KR | 10-1182447 B1 | 9/2012 |

OTHER PUBLICATIONS

Vorobyev et al., "Reflection of Femtosecond Laser Light in Multipulse Ablation of Metals", Journal of Applied Physics 110, 043102 (2011), doi: 10.1063/1.3620898, pp. 1-9.

* cited by examiner

ORGANIC LIGHT-EMITTING DISPLAY APPARATUS AND METHOD OF MANUFACTURING THE SAME

CROSS-REFERENCE TO RELATED APPLICATION

Korean Patent Application No. 10-2014-0052979, filed on Apr. 30, 2014, in the Korean Intellectual Property Office, and entitled: "Organic Light-Emitting Display Apparatus and Method of Manufacturing the Same," is incorporated by reference herein in its entirety.

BACKGROUND

1. Field

One or more embodiments relate to an organic light-emitting display apparatus and a method of manufacturing the same.

2. Description of the Related Art

Organic light-emitting display apparatuses, which may exhibit wide viewing angles, high contrast ratios, and high response speeds, may be suitable as displays.

SUMMARY

Embodiments may be realized by providing an organic light-emitting display apparatus, including a substrate; a first pixel electrode for first color emission, a second pixel electrode for second color emission, and a third pixel electrode for third color emission, the first pixel electrode, the second pixel electrode, and the third pixel electrode being spaced apart from each other on the substrate; a first color emission layer on the first pixel electrode, a second color emission layer on the second pixel electrode, and a third color emission layer on the third pixel electrode; an opposite electrode on the first color emission layer, the second color emission layer, and the third color emission layer; and a capping layer that includes a same material as the opposite electrode and is porous.

The capping layer may be integrally formed with the opposite electrode.

A thickness of the capping layer may vary on the first pixel electrode, the second pixel electrode, and the third pixel electrode.

The capping layer may include a first capping layer corresponding to the first pixel electrode, a second capping layer corresponding to the second pixel electrode, and a third capping layer corresponding to the third pixel electrode, and a thickness of the first capping layer may be in a range of about 100 Å to about 700 Å, a thickness of the second capping layer may be in a range of about 100 Å to about 800 Å, and a thickness of the third capping layer may be in a range of about 100 Å to about 1000 Å.

The capping layer may be formed by laser ablation.

Embodiments may be realized by providing a method of manufacturing an organic light-emitting display apparatus, the method including preparing a substrate; forming a first pixel electrode for first color emission, a second pixel electrode for second color emission, and a third pixel electrode for third color emission, the first pixel electrode, the second pixel electrode, and the third pixel electrode being spaced apart from each other on the substrate; forming a first color emission layer corresponding to the first pixel electrode, a second color emission layer corresponding to the second pixel electrode, and a third color emission layer corresponding to the third pixel electrode; forming a metal layer on the first color emission layer, the second color emission layer, and the third color emission layer; and forming a capping layer by irradiating laser to at least a portion of a surface of the metal layer.

Forming the capping layer may include changing structural characteristics and optical characteristics of at least a portion of the surface of the metal layer.

Forming the capping layer may include changing at least a portion of the surface of the metal layer to be porous.

The metal layer may be formed to have a thickness of about 200 Å to about 2000 Å.

Forming the capping layer may include not irradiating a lower portion of the metal layer having a thickness of about 50 Å to about 150 Å.

A thickness of the capping layer may vary on the first pixel electrode, the second pixel electrode, and the third pixel electrode.

Forming the capping layer may include forming a first capping layer on the first pixel electrode; forming a second capping layer on the second pixel electrode; and forming a third capping layer on the third pixel electrode.

The first capping layer may be formed to have at a thickness of about 100 Å to about 700 Å, the second capping layer may be formed to have at a thickness of about 100 Å to about 800 Å, and the third capping layer may be formed to have at a thickness of about 100 Å to about 1000 Å.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
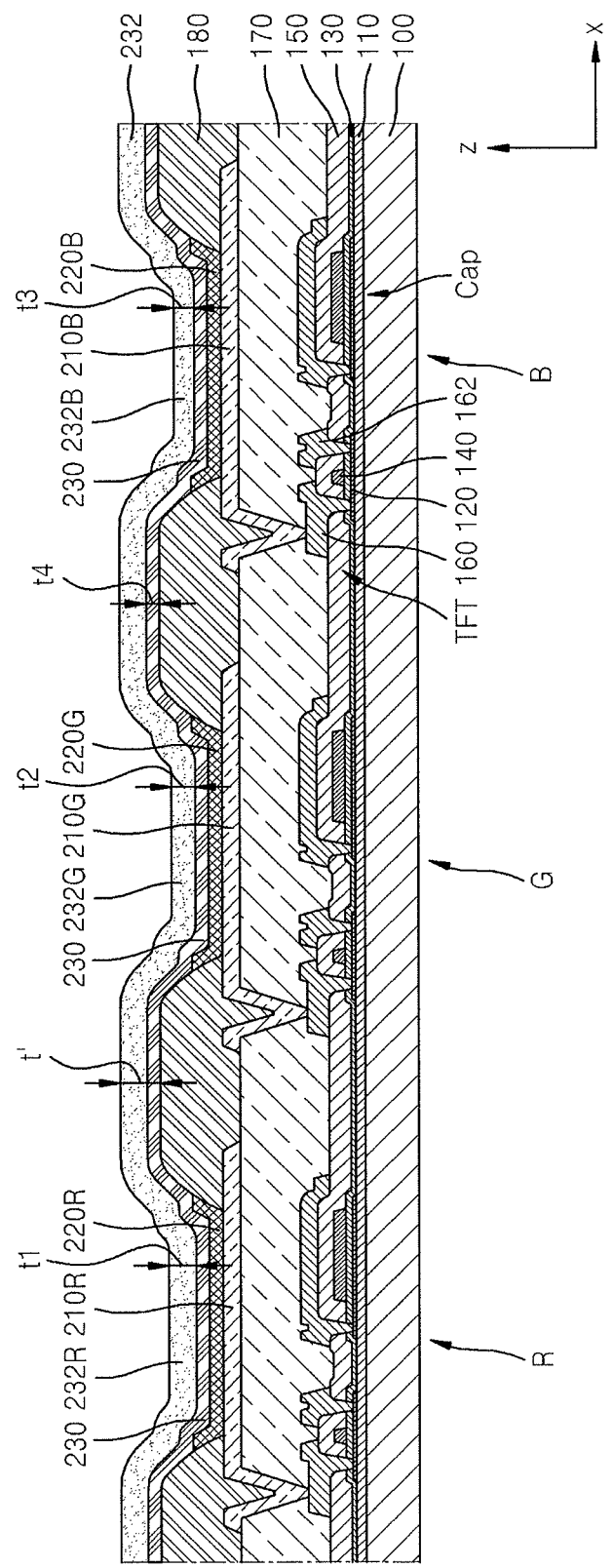
FIG. 1 illustrates a schematic cross-sectional view of an organic light-emitting display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, like reference numerals refer to like elements throughout. Sizes of elements in the drawings may be exaggerated for convenience of explanation.

As used herein, the term "and/or" includes any and all combinations of one or more of the associated listed items It will be understood that although the terms "first," "second," etc., may be used herein to describe various components, these components should not be limited by these terms. These components are only used to distinguish one component from another. As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

FIG. 1 illustrates a schematic cross-sectional view of an organic light-emitting display apparatus according to an embodiment.

Referring to FIG. 1, an organic light-emitting display apparatus according to an embodiment may include a substrate 100, a first pixel electrode 210R, a second pixel electrode 210G, and a third pixel electrode 210B, which are disposed on the substrate 100, a first color emission layer 220R, a second color emission layer 220G, and a third color emission layer 220B, which are disposed corresponding to, e.g., on, the first, second, and third pixel electrodes 210R, 210G, and 210B, respectively, an opposite electrode 230 disposed on the first, second, and third emission layers 220R, 220G, and 220B, respectively, corresponding to the pixel electrodes 210R, 210G, and 210B, and a capping layer 232 disposed on the opposite electrode 230.

The substrate 100 may be formed of various materials, for example, glass, metal, or a plastic material, such as polyethylen terephthalate (PET), polyethylen naphthalate (PEN), or polyimide. The substrate 100 may have a display region on which a plurality of pixels are disposed, and a peripheral region surrounding the display region.

The first, second, and third pixel electrodes 210R, 210G, and 210B may be spaced apart from each other on the substrate 100. The first, second, and third pixel electrodes 210R, 210G, and 210B may be located on the display region of the substrate 100. The first, second, and third pixel electrodes 210R, 210G, and 210B may be a pixel electrode for emission of first color, a pixel electrode for emission of second color, and a pixel electrode for emission of third color, respectively. For example, the first color may be red (R), the second color may be green (G), and the third color may be blue (B).

The first, second, and third pixel electrodes 210R, 210G, and 210B may each be formed as a transparent or semi-transparent electrode or a reflective electrode. When formed as a transparent or semi-transparent electrode, for example, ITO, IZO, ZnO, $In_2O_3$, IGO, or AZO may be used. When formed as a reflective electrode, each of the first, second, and third pixel electrodes 210R, 210G, and 210B may include a reflective film formed of Ag, Mg, Al, Pt, Pd, Au, Ni, Nd, Ir, Cr, or a mixture thereof, and a layer formed of ITO, IZO, ZnO, $In_2O_3$, IGO, or AZO. However, various other materials may be used to form the first, second, and third pixel electrodes 210R, 210G, and 210B. Also, each of the first, second, and third pixel electrodes 210R, 210G, and 210B may have various other structures, such as a single-layered structure or a multi-layered structure.

The first, second, and third emission layers 220R, 220G, and 220B may be disposed on the first, second, and third pixel electrodes 210R, 210G, and 210B, respectively. The first color emission layer 220R may be disposed corresponding to the first pixel electrode 210R, the second color emission layer 220G may be disposed corresponding to the second pixel electrode 210G, and the third color emission layer 220B may be disposed corresponding to the third pixel electrode 210B.

Although the first, second, and third emission layers 220R, 220G, and 220B illustrated in FIG. 1 may each be a single layer, the first, second, and third emission layers 220R, 220G, and 220B may further include other layers in addition to the first, second, and third emission layers 220R, 220G, and 220B, and the first, second, and third emission layers 220R, 220G, and 220B may be considered as an intermediate layer having a multi-layered structure. For ease of explanation, hereinafter, each of the first, second, and third emission layers 220R, 220G, and 220B may be understood as an intermediate layer having a multi-layered structure substantially including a corresponding one of the first, second, and third emission layers 220R, 220G, and 220B.

The intermediate layer may include, for example, an emission layer (EML), and may further include a hole injection layer (HIL), a hole transport layer (HTL), an electron transport layer (ETL), and an electron injection layer (EIL), each of which may have a single-layered structure or a multi-layered structure. Some layers of the intermediate layer including the EML may be common layers corresponding to the whole surface of the substrate 100, and other layers thereof may be pattern layers formed by patterning corresponding to the first, second, and third pixel electrodes 210R, 210G, and 210B.

The first, second, and third emission layers 220R, 220G, and 220B may include a low molecular weight organic material or a polymer organic material. When the first, second, and third emission layers 220R, 220G, and 220B include a low molecular weight organic material, for example, hole transport layers (HTLs), hole injection layers (HILs), electron transport layers (ETLs), and electron injection layers (EILs) may be stacked around emission layers (EMLs). In some embodiments, various other layers may be further stacked according to purpose. An organic material available herein may be, for example, copper phthalocyanine (CuPc), N'-di(naphthalene-1-yl)-N, N'-diphenyl-benzidine (NPB), or tris-8-hydroxyquinoline aluminum (Alq3).

When the first, second, and third emission layers 220R, 220G, and 220B include polymer organic materials, for example, a HTL may be further included in addition to the EML. The HTL may include poly ethylenedioxythiophene (PEDOT), poly-2,4-ethylene-dihydroxy thiophene, or polyaniline (PANI). An example of the available organic material may be, for example, a poly-phenylenevinylene (PPV)-based polymer organic material or a polyfluorene-based polymer organic material.

The HTL, the HIL, the ETL, and the EIL may be integrally formed on the whole surface of the substrate 100, and only the EML may be formed by inkjet printing for each pixel. The first, second, and third emission layers 220R, 220G, and 220B may be formed by using various methods, for example, at least one method selected from a deposition method, a spin coating method, an inkjet printing method, and a laser thermal transferring method.

The opposite electrode 230 covering the first, second, and third emission layers 220R, 220G, and 220B and facing the first, second, and third pixel electrodes 210R, 210G, and 210B may be disposed over the whole surface of the substrate 100. A thickness t' of the opposite electrode 230 may be in a range of, for example, about 50 Å to about 150 Å.

The opposite electrode 230 may be formed as a semi-transparent electrode or a reflective electrode. When the opposite electrode 230 is formed as a semi-transparent electrode, the opposite electrode 230 may include a metal having a low work function, for example, Li, Ca, LiF/Ca, LiF/Al, Al, Ag, Mg, or a mixture thereof, and a semi-transparent conductive layer, such as ITO, IZO, ZnO, or $In_2O_3$. When the opposite electrode 230 is formed as a reflective electrode, the opposite electrode 230 may include a layer having Li, Ca, LiF/Ca, LiF/Al, Al, Ag, Mg, or a mixture thereof.

The capping layer 232 may be disposed on the opposite electrode 230. In an embodiment, the capping layer 232 illustrated in FIG. 1 corresponds to the whole surface of the substrate 100. In some embodiments, the capping layer 232 may be patterned to correspond to, e.g., be on, only an emission layer.

The capping layer 232 may be porous. The capping layer 232 being porous means that the capping layer 232 may have, for example, a surface having bowl-shaped craters. The porous structure having craters may change optical properties of the capping layer 232, and light emitted toward outside through the capping layer 232 may have improved light extraction efficiency.

The capping layer 232 may be integrally formed with the opposite electrode 230. As in a manufacturing process for the capping layer 232, a metal layer 230' (see FIG. 3) corresponding to the opposite electrode 230 may be formed to have a thickness that is greater than a thickness t4 of the opposite electrode 230. Laser may be irradiated to an upper portion of the metal layer 230'. A portion of the metal layer 230' to which the laser is irradiated may be etched, other portions thereof may have changed film characteristics, and the capping layer 232 may be formed. The film characteristics of the metal layer 230' being changed means that a micro structure of the laser irradiated portion may be changed to have porosity or craters, and optical characteristics, for example, at least one selected from reflectance and absorptance, of the upper portion of the metal layer 230', may change. The capping layer 232 may be integrally formed with the opposite electrode 230.

In some embodiments, the capping layer 232 may include the same material as used in the opposite electrode 230. The capping layer 232 may be formed by changing film characteristics of an upper portion of a metal layer corresponding to the opposite electrode 230. The capping layer 232 may be formed of a material used to form the opposite electrode 230, and for example, may include one or more selected from Li, Ca, LiF/Ca, LiF/Al, Al, Ag, Mg, a mixture of the forgoing materials, ITO, IZO, ZnO, and $In_2O_3$.

In an organic light-emitting display apparatus, total reflection occurring at a boundary surface of a glass substrate contacting an air layer and a waveguide mode combination proceeding along an optical waveguide constituted of an ITO-organic layer may result in 80% or more of light generated inside the organic light-emitting display apparatus may being extracted toward the outside. A capping layer (CPL) subjected to a separate process may be further disposed on an opposite electrode to increase light extraction efficiency of an emission unit. Different emission wavelengths of R, G, and B sub pixels may result in varying thickness of a capping layer that allows light generated in an emission layer to be induced to progress toward the outside of an organic light-emitting display apparatus according to, e.g., on, R, G, and B sub pixels.

In an organic light-emitting display apparatus according to an embodiment, in forming the capping layer 232, without a separate process, the surface of a metal layer corresponding to the opposite electrode 230 may be subjected to laser ablation to change optical characteristics thereof, forming the capping layer 232, and partial etching may result in the capping layer 232 having different thicknesses t1, t2, and t3 corresponding to R, G, and B. Light extraction efficiency of the organic light-emitting display apparatus may be maximized.

In an embodiment, portions of the capping layer 232 respectively corresponding to the first pixel electrode 210R, the second pixel electrode 210G, and the third pixel electrode 210B may have different thicknesses t1, t2, and t3. As described above, to maximize the light extraction effects of the capping layer 232, the capping layer 232 may have the thicknesses t1, t2, and t3 that are optimized according to an emission wavelength of each sub pixel.

The capping layer 232 may include the first capping layer 232R, the second capping layer 232G, and the third capping layer 232B, respectively, corresponding to the first, second, and third pixel electrodes 210R, 210G, and 210B. The capping layer 232 may include a first capping layer 232R corresponding to the first pixel electrode 210R, a second capping layer 232G corresponding to the second pixel electrode 210G, and a third capping layer 232B corresponding to the third pixel electrode 210B. In some embodiments, the thickness t1 of the first capping layer 232R may be in a range of about 100 Å to about 700 Å, the thickness t2 of the second capping layer 232G may be in a range of about 100 Å to about 800 Å, and the thickness t3 of the third capping layer 232B may be in a range of about 100 Å to about 1000 Å.

In some embodiments, various constituents may be further disposed on the substrate 100. For example, as illustrated in FIG. 1, a capacitor Cap and a thin film transistor TFT may be disposed on the substrate 100. The thin film transistor TFT may include a semiconductor layer 120 including amorphous silicon, polycrystalline silicon, or an organic semiconductor material, a gate electrode 140, a source electrode 162, and a drain electrode 160. Hereinafter, a typical structure of a thin film transistor TFT, and various constituents disposed on the substrate 100 will be described in detail.

On the substrate 100, a buffer layer 110 formed of, for example, siliconoxide or siliconnitride may be disposed either to planarize the substrate 100 or to prevent permeation of impurities into the semiconductor layer 120, and the semiconductor layer 120 may be disposed on the buffer layer 110.

The gate electrode 140 may be disposed on the semiconductor layer 120, and according to a signal applied to the gate electrode 140, the gate electrode 140 may be electrically connected to the source electrode 162 or the drain electrode 160. The gate electrode 140 may be, in consideration of closeness to an adjacent layer, and surface planarization and workability of a layer to be stacked, formed of at least one material selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) in the form of a single layer or multiple layers.

To insulate the semiconductor layer 120 from the gate electrode 140, a gate insulating film 130 formed of at least one selected from siliconoxide and siliconnitride may be disposed between the semiconductor layer 120 and the gate electrode 140.

An interlayer insulating layer 150 may be disposed on the gate electrode 140, and may be formed of siliconoxide or siliconnitride in the form of a single layer or multiple layers.

The source electrode 162 and the drain electrode 160 may be disposed on the interlayer insulating layer 150. The source electrode 162 and the drain electrode 160 may be each electrically connected to the semiconductor layer 120 through contact holes formed in the interlayer insulating layer 150 and the gate insulating film 130. In consideration of conductivity, the source electrode 162 and the drain electrode 160 may be formed of at least one material selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) in the form of a single layer or multiple layers.

To protect a thin film transistor TFT having such a structure, although not illustrated in FIG. 1, a protective film (not shown) may be disposed to cover the thin film transistor TFT. The protective film may be formed of an inorganic material, such as siliconoxide, siliconnitride, or siliconoxynitride. The protective film may have, for example, a single-layered structure or a multi-layered structure.

Also, a planarization layer 170 may be disposed on the substrate 100. The planarization layer 170 may act as a protective film. As illustrated in FIG. 1, organic light-emitting devices may be disposed on the thin film transistor TFT, and the planarization layer 170 may be disposed to planarize an upper portion of the thin film transistor TFT. The protective film (not shown) and the planarization layer 170 may be formed of, for example, an acryl-based organic material or benzocyclobutene (BCB). As illustrated in FIG. 1, the gate insulating film 130, the interlayer insulating layer 150, a protective film (not shown), and the planarization layer 170 may be disposed on the whole surface of the substrate 100.

A pixel defining film 180 may be disposed on the thin film transistor TFT. The pixel defining film 180 may be disposed on the planarization layer 170, and may have an opening. The opening of the pixel defining film 180 may define a pixel region on the display region of the substrate 100.

The pixel defining film 180 may include, for example, an organic insulating film. The organic insulating film may include an acryl-based polymer, such as polymethylmethacrylate (PMMA), polystyrene (PS), a polymer derivative having a phenol group, an imide-based polymer, an aryether-based polymer, an amide-based polymer, a fluorine-based polymer, a p-xylene-based polymer, a vinyl alcohol-based polymer, or a mixture thereof.

As described above, in an organic light-emitting display apparatus according to an embodiment, in forming the capping layer 232, without a separate process, the surface of a metal layer corresponding to the opposite electrode 230 may be subjected to laser ablation to change optical characteristics thereof, forming the capping layer 232, and at the same time, partial etching may result in the capping layer 232 having different thicknesses t1, t2, and t3 corresponding to R, G, and B. Light extraction efficiency of the organic light-emitting display apparatus may be maximized.

An organic light-emitting display apparatus has been described. A method of manufacturing an organic light-emitting display apparatus will now be described.

Figure 2:
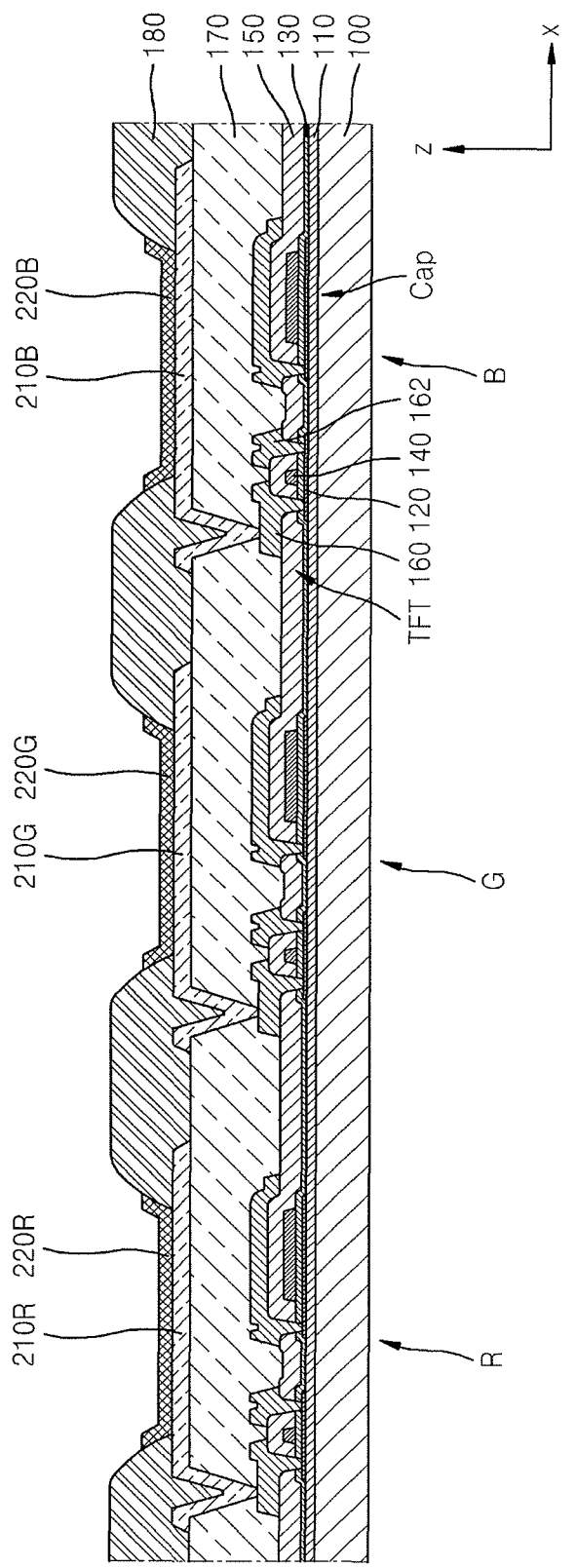
FIGS. 2 to 4 illustrate cross-sectional views schematically of a method of manufacturing an organic light-emitting display apparatus according to an embodiment.
Figure 3:
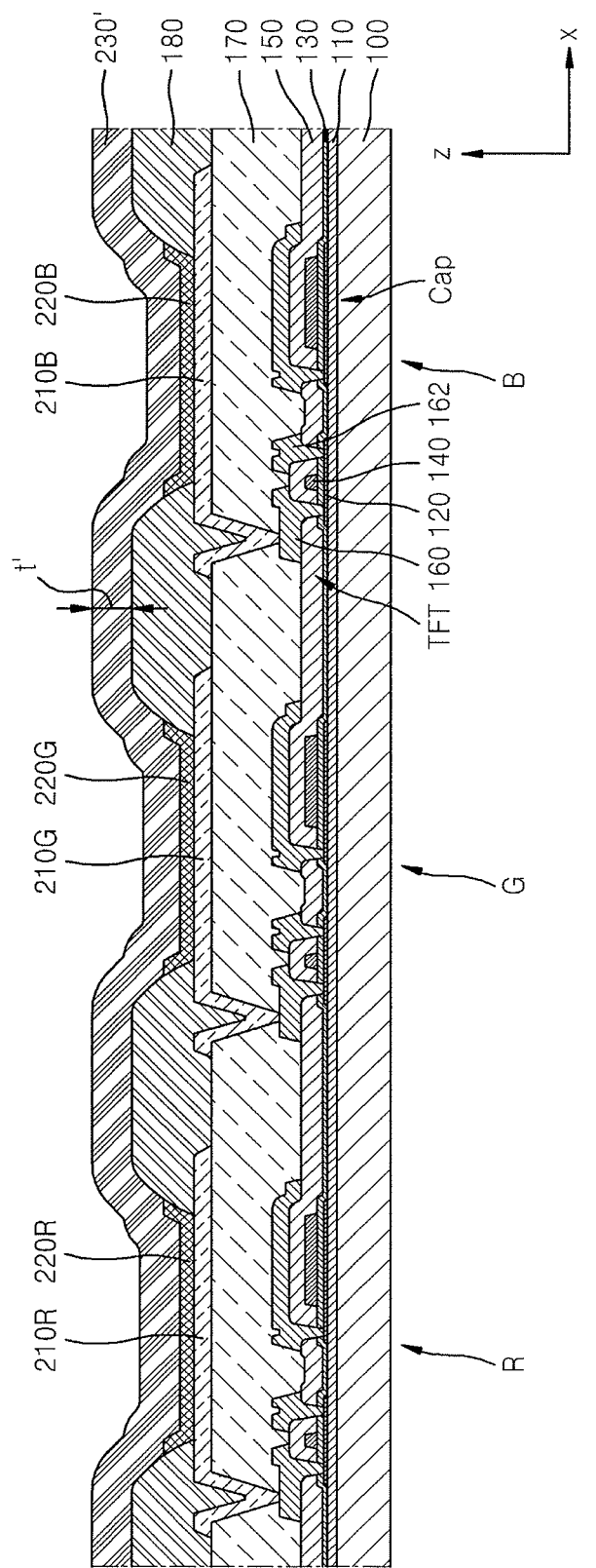
Figure 4:
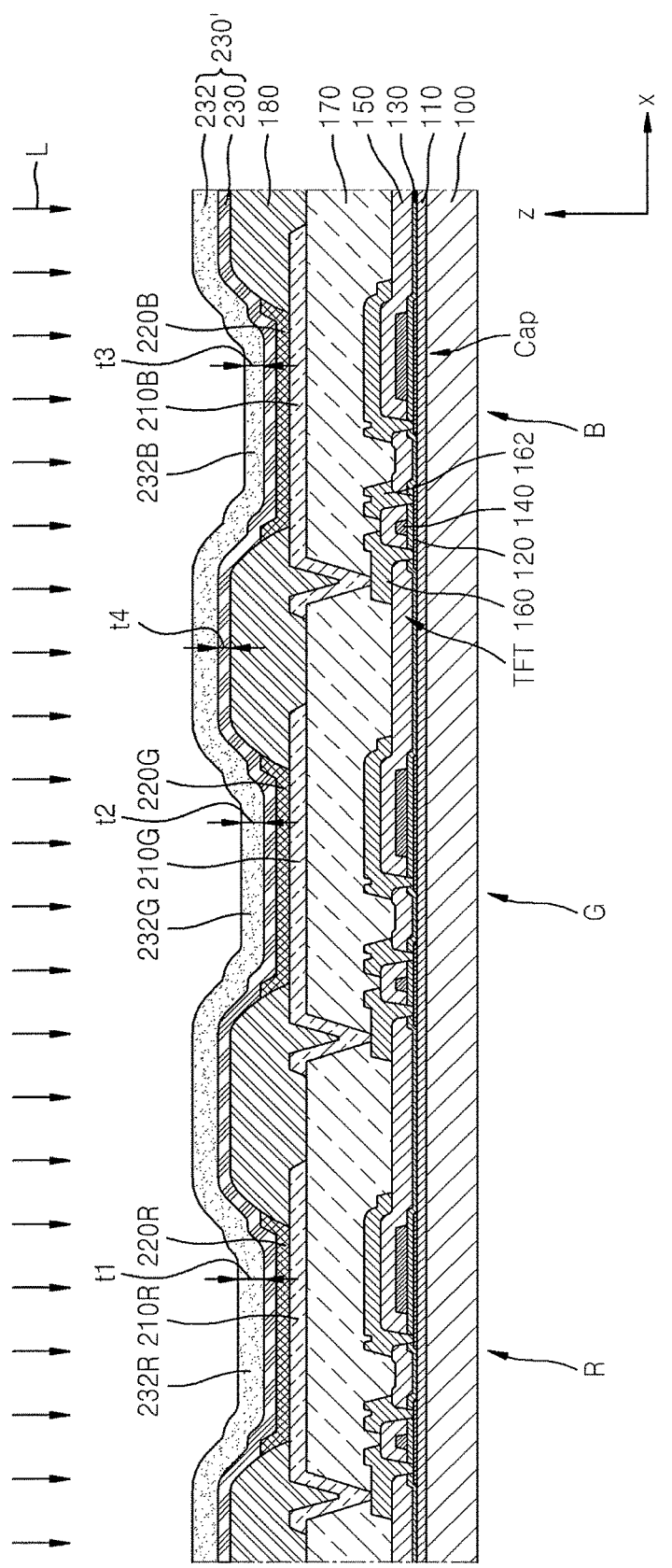

FIGS. 2 to 4 illustrate cross-sectional views schematically of a method of manufacturing an organic light-emitting display apparatus according to an embodiment. Hereinafter, a method of manufacturing an organic light-emitting display apparatus will be described in detail. However, materials for constituents of the organic light-emitting display apparatus are the same as described above, and an explanation for the materials will not be presented herein.

Referring to FIG. 2, in the method of manufacturing an organic light-emitting display apparatus, the substrate 100 may be prepared. The substrate 100 may be formed of various materials, for example, glass, metal, or a plastic material.

Then, the first, second, and third pixel electrodes 210R, 210G, and 210B may be formed on the substrate 100. The first, second, and third pixel electrodes 210R, 210G, and 210B may be spaced from each other on the substrate 100. The first, second, and third pixel electrodes 210R, 210G, and 210B may be a pixel electrode for emission of first color, a pixel electrode for emission of second color, and a pixel electrode for emission of third color, respectively. For example, the first color may be red (R), the second color may be green (G), and the third color may be blue (B).

The first, second, and third pixel electrodes 210R, 210G, and 210B may each be formed as a (semi-)transparent electrode or a reflective electrode. In some embodiments, each of the first, second, and third pixel electrodes 210R, 210G, and 210B may have, for example, a single-layered structure or a multi-layered structure.

Furthermore, the first, second, and third emission layers 220R, 220G, and 220B may be formed to correspond to, e.g., be on, the first, second, and third pixel electrodes 210R, 210G, and 210B, respectively. The first color emission layer 220R may be formed on the first pixel electrode 210R, the second color emission layer 220G may be formed on the second pixel electrode 210G, and the third color emission layer 220B may be formed on the third pixel electrode 210B. A red emission layer may be formed on the first pixel electrode 210R, a green emission layer may be formed on the second pixel electrode 210G, and a blue emission layer may be formed on the third pixel electrode 210B.

The first, second, and third emission layers 220R, 220G, and 220B illustrated in FIG. 1 are single layers. However, the first, second, and third emission layers 220R, 220G, and 220B may be understood as an intermediate layer having a multi-layered structure including other layers in addition to the EML. For ease of explanation, hereinafter, each of the first, second, and third emission layers 220R, 220G, and 220B may be understood as an intermediate layer having a multi-layered structure substantially including an EML. Some layers of the intermediate layer including the EML may be common layers corresponding to the whole surface of the substrate 100, and other layers thereof may be pattern layers formed by patterning corresponding to the first, second, and third pixel electrodes 210R, 210G, and 210B.

The intermediate layer may include an EML, and may further include, for example, at least one layer selected from a HIL, a HTL, an ETL, and an EIL.

The first, second, and third emission layers 220R, 220G, and 220B may be formed by using various methods, for example, at least one method selected from a deposition method, a spin coating method, an inkjet printing method, and a laser thermal transferring method.

Then, referring to FIG. 3, a metal layer 230' may be formed on the first, second, and third emission layers 220R, 220G, and 220B to correspond to the first, second, and third pixel electrodes 210R, 210G, and 210B. The metal layer 230' may be formed on the whole surface of the substrate 100. The thickness t' of the metal layer 230' may be in the range of about 200 Å to 2000 Å. The thickness t' of the metal layer 230' may be greater than that of an opposite electrode of a general organic light-emitting display apparatus.

The metal layer 230' may be formed of, for example, Li, Ca, LiF/Ca, LiF/Al, Al, Ag, Mg, or a mixture thereof, ITO, IZO, ZnO, or $In_2O$.

Then, referring to FIG. 4, a laser L may be irradiated to at least a portion of the surface of the metal layer 230' facing away from the substrate 100 (e.g., +z direction) to form the capping layer 232. Although the laser L illustrated in FIG. 4 is irradiated to the whole surface of the substrate 100, in some embodiments, the laser L may be irradiated to only a portion of the surface of the metal layer 230' where the capping layer 232 may be formed.

Furthermore, in forming the capping layer 232 by the irradiation of laser L to the metal layer 230', a portion of a lower portion of the metal layer 230' that is not subjected to the irradiation with laser L may be the opposite electrode 230. Laser L may be irradiated to a portion of the metal layer 230' other than a lower portion thereof having the thickness t4 of about 50 Å to about 150 Å to form the capping layer 232, and the lower portion of the metal layer 230' having the thickness t4 of about 50 Å to about 150 Å may be the opposite electrode 230. The irradiation with laser L to the metal layer 230' may enable the simultaneous formation of the opposite electrode 230 and the capping layer 232, and the opposite electrode 230 and the capping layer 232 may be formed of the same material.

In a method of manufacturing an organic light-emitting display apparatus, a capping layer may be formed on an opposite electrode by using a separate process. However, in the method of manufacturing an organic light-emitting display apparatus according to an embodiment, a separate process may not be needed to form the capping layer 232 on the opposite electrode 230, and may lead to simplification of the manufacturing process.

In forming the capping layer 232, from among portions of the metal layer 230' to which the laser L is irradiated, at least a portion may be etched, and other portions may undergo a change in structural characteristics and optical characteristics. The change in structural characteristics and optical characteristics of the metal layer 230' means that the microstructure of the portion to which a laser L may be irradiated may have porosity or craters, and optical characteristics of reflectance and/or absorptance of an upper portion of the metal layer 230' may change.

The forming of the capping layer 232 may include forming the first capping layer 232R corresponding to the first pixel electrode 210R, forming the second capping layer 232G corresponding to the second pixel electrode 210G, and forming the third capping layer 232B corresponding to the third pixel electrode 210B. The forming the first capping layer 232R, the forming the second capping layer 232G, and the forming the third capping layer 232B may be sequentially or simultaneously performed.

In forming the first capping layer 232R, forming the second capping layer 232G, and forming the third capping layer 232B, the first capping layer 232R, the second capping layer 232G, and the third capping layer 232B may have different thicknesses t1, t2, and t3 according to the first pixel electrode 210R, the second pixel electrode 210G, and the third pixel electrode 210B. The difference in emission wavelength of sub pixels (R, G, and B) may give rise to an optimized thickness of the capping layer 232, which may vary according to sub pixels (R, G, and B). The thickness t1 of first capping layer 232R may be in a range of about 100 Å to about 700 Å, the thickness t2 of the second capping layer 232G may be in a range of about 100 Å to about 800 Å, and the thickness t3 of the third capping layer 232B may be in a range of about 100 Å to about 1000 Å.

In an organic light-emitting display apparatus, total reflection occurring at a boundary surface of a glass substrate contacting an air layer and a waveguide mode combination present along an optical waveguide constituted of an ITO-organic layer may result in 80% or more of light generated inside the organic light-emitting display apparatus not being extracted toward the outside. In an organic light-emitting display apparatus, a capping layer (CPL) subjected to a separate process may be further disposed on an opposite electrode to increase light extraction efficiency of an emission unit. Different emission wavelengths of R, G, and B sub pixels may result in varying thickness of a capping layer that allows light generated in the emission layer to be induced to progress toward the outside of an organic light-emitting display apparatus according to R, G, and B sub pixels.

In an organic light-emitting display apparatus according to an embodiment, in forming the capping layer 232, without a separate process, the surface of the metal layer 230' corresponding to the opposite electrode 230 may be subjected to laser ablation to form the capping layer 232 having a thickness (t1, t2, or t3) that varies according to R, G, and B. Light extraction efficiency of the organic light-emitting display apparatus may be maximized.

In some embodiments, in addition to these processes described above, if needed, various other constituents may be formed. For example, as illustrated in FIGS. 2 to 4, a capacitor Cap and a thin film transistor TFT may be disposed on the substrate 100.

The thin film transistor TFT may be subjected to forming of the buffer layer 110 formed of siliconoxide or siliconnitride on the substrate 100 either to planarize the surface of the substrate 100 or to prevent permeation of impurities into the semiconductor layer 120. Thereafter, patterning of the semiconductor layer 120 including amorphous silicon, polycrystallinesilicon, or an organic semiconductor material may be formed on the buffer layer 110.

On the semiconductor layer 120, the gate insulating film 130 formed of at least one selected from siliconoxide and silicon nitride may be formed to insulate the semiconductor layer 120 from the gate electrode 140. Thereafter, the gate electrode 140 including amorphous silicon, polycrystalline silicon or an organic semiconductor material may be patterned on the gate insulating film 130. According to a signal applied to the gate electrode 140, the source electrode 162 and the drain electrode 160 may be in electrical communication with each other.

The interlayer insulating layer 150 may be disposed on the gate electrode 140, and may be formed of silicon oxide or silicon nitride in the form of a single layer or multiple layers.

The source electrode 162 and the drain electrode 160 may be formed on the interlayer insulating layer 150. The source electrode 162 and the drain electrode 160 may be each electrically connected to the semiconductor layer 120 through contact holes formed in the interlayer insulating layer 150 and the gate insulating film 130.

To protect a thin film transistor TFT having such a structure, although not illustrated in FIGS. 2 to 4, a protective film (not shown) may be further formed to cover the thin film transistor TFT. The protective film may be formed of an inorganic material, such as siliconoxide, siliconnitride or siliconoxynitride. The protective film may have, for example, a single-layered structure or a multi-layered structure.

Also, the planarization layer 170 may be formed on the substrate 100. The planarization layer 170 may act as a protective film. As illustrated in FIGS. 2 to 4, organic light-emitting devices may be disposed on the thin film transistor TFT, and the planarization layer 170 may be formed to planarize an upper portion of the thin film transistor TFT. As illustrated in FIGS. 2 to 4, the gate insulating film 130, the interlayer insulating layer 150, the protective film, and the planarization layer 170 may be disposed on the whole surface of the substrate 100.

The pixel defining film 180 may be formed on the thin film transistor TFT. The pixel defining film 180 may be formed on the planarization layer 170 and may be subjected to patterning to form an opening therein. The opening of the pixel defining film 180 may define a pixel region on the display region of the substrate 100.

In an organic light-emitting display apparatus according to an embodiment, in forming the capping layer 232, without a separate process, the surface of the metal layer 230' corresponding to the opposite electrode 230 may be subjected to laser ablation to form the capping layer 232 having a thickness (t1, t2, or t3) that varies according to R, G, and B. Light extraction efficiency of the organic light-emitting display apparatus may be maximized.

As described above, according to an embodiment, an organic light-emitting display apparatus with light extraction efficiency maximized in each sub pixel and a method of manufacturing the same are provided.

By way of summation and review, generally, in an organic light-emitting display apparatus, thin film transistors and organic light-emitting devices may be disposed on a substrate, and the organic light-emitting devices may self-emit light. Such an organic light-emitting display apparatus may be used as a display unit for small products, such as a mobile phone, or large products, such as a television.

An organic light-emitting display apparatus may include organic light-emitting devices as pixels (or sub-pixels), and an intermediate layer including an emission layer may be disposed between a pixel electrode and an opposite electrode in one of the organic light-emitting devices. In such an organic light-emitting display apparatus, in general, whether or not a pixel emits light or a degree of emission of a pixel may be controlled via a thin film transistor electrically connected to a pixel electrode, and an opposite electrode may be commonly shared by a plurality of pixels (or sub-pixels).

However, in organic light-emitting display apparatuses, light generated therein may be mostly trapped inside the organic light-emitting display apparatuses.

One or more embodiments relate to an organic light-emitting display apparatus having light extraction efficiency that may be maximized in each sub pixel and a method of manufacturing the same.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display apparatus, comprising:
   a substrate;
   a first pixel electrode for first color emission, a second pixel electrode for second color emission, and a third pixel electrode for third color emission, the first pixel electrode, the second pixel electrode, and the third pixel electrode being spaced apart from each other on the substrate;
   a first color emission layer on the first pixel electrode, a second color emission layer on the second pixel electrode, and a third color emission layer on the third pixel electrode;
   a metal opposite electrode on the first color emission layer, the second color emission layer, and the third color emission layer; and
   a capping layer, the capping layer being porous and including a same material as the opposite electrode and being integral therewith.

2. The organic light-emitting display apparatus as claimed in claim 1, wherein a thickness of the capping layer varies on the first pixel electrode, the second pixel electrode, and the third pixel electrode.

3. The organic light-emitting display apparatus as claimed in claim 2, wherein:
   the capping layer includes a first capping layer corresponding to the first pixel electrode, a second capping layer corresponding to the second pixel electrode, and a third capping layer corresponding to the third pixel electrode, and
   a thickness of the first capping layer is in a range of about 100 Å to about 700 Å, a thickness of the second capping layer is in a range of about 100 Å to about 800 Å, and a thickness of the third capping layer is in a range of about 100 Å to about 1000 Å.

4. The organic light-emitting display apparatus as claimed in claim 1, wherein the capping layer is formed by laser ablation.

5. A method of manufacturing an organic light-emitting display apparatus, the method comprising:
   preparing a substrate;
   forming a first pixel electrode for first color emission, a second pixel electrode for second color emission, and a third pixel electrode for third color emission , the first pixel electrode, the second pixel electrode, and the third pixel electrode being spaced apart from each other on the substrate;
   forming a first color emission layer corresponding to the first pixel electrode, a second color emission layer corresponding to the second pixel electrode, and a third color emission layer corresponding to the third pixel electrode;
   forming a metal layer on the first color emission layer, the second color emission layer, and the third color emission layer; and
   forming a capping layer by irradiating a laser to at least a portion of an upper portion of the metal layer, the capping layer being integrally formed at the upper portion of the metal layer, a lower portion of the metal layer forming an opposite electrode to the pixel electrodes.

6. The method as claimed in claim 5, wherein forming the capping layer includes changing structural characteristics and optical characteristics of at least a portion of the surface of the metal layer.

7. The method as claimed in claim 5, wherein forming the capping layer includes changing at least a portion of the surface of the metal layer to be porous.

8. The method as claimed in claim 7, wherein:
the capping layer includes a first porous portion having a first thickness on the first pixel electrode, a second porous portion having a second thickness on the second pixel electrode, and a third porous portion having a third thickness on the third pixel electrode, and
the first thickness, the second thickness, and the third thickness are different.

9. The method as claimed in claim 5, wherein the metal layer is formed to have a thickness of about 200 Å to about 2000 Å.

10. The method as claimed in claim 5, wherein forming the capping layer includes:
forming a first capping layer on the first pixel electrode;
forming a second capping layer on the second pixel electrode; and
forming a third capping layer on the third pixel electrode.

11. The method as claimed in claim 10, wherein the first capping layer is formed to have at a thickness of about 100 Å to about 700 Å, the second capping layer is formed to have at a thickness of about 100 Å to about 800 Å, and the third capping layer is formed to have at a thickness of about 100 Å to about 1000 Å.

12. The method as claimed in claim 5, wherein the metal layer includes Li, Ca, LiF/Ca, LiF/Al, Al, Ag, Mg, or a mixture thereof, indium tin oxide, indium zinc oxide, ZnO, or $In_2O_3$.

13. An organic light-emitting display apparatus manufactured according to the method as claimed in claim 5.

14. A method of manufacturing an organic light-emitting display apparatus, the method comprising:
preparing a substrate;
forming a first pixel electrode for first color emission, a second pixel electrode for second color emission, and a third pixel electrode for third color emission, the first pixel electrode, the second pixel electrode, and the third pixel electrode being spaced apart from each other on the substrate;
forming a first color emission layer corresponding to the first pixel electrode, a second color emission layer corresponding to the second pixel electrode, and a third color emission layer corresponding to the third pixel electrode;
forming a metal layer on the first color emission layer, the second color emission layer, and the third color emission layer; and
forming a capping layer by irradiating laser to at least a portion of a surface of the metal layer,
wherein:
the metal layer is formed to have a thickness of about 200 Å to about 2000 Å, and
forming the capping layer includes not irradiating a lower portion of the metal layer having a thickness of about 50 Å to about 150 Å.

* * * * *